United States Patent [19]
Smith et al.

[11] Patent Number: 4,618,767
[45] Date of Patent: Oct. 21, 1986

[54] LOW-ENERGY SCANNING TRANSMISSION ELECTRON MICROSCOPE

[75] Inventors: David A. Smith, Katonah; Oliver C. Wells, Yorktown Heights, both of N.Y.

[73] Assignee: International Business Machines Corporation, Armonk, N.Y.

[21] Appl. No.: 715,139

[22] Filed: Mar. 22, 1985

[51] Int. Cl.⁴ .............................................. H01J 37/26
[52] U.S. Cl. ..................................... 250/311; 250/306
[58] Field of Search ........................ 250/311, 306, 307

[56] References Cited

U.S. PATENT DOCUMENTS 4,343,993  8/1982  Binnig et al. ......................... 250/306
4,550,257 10/1985  Binnig et al. ....................... 250/492.2

Primary Examiner—Bruce C. Anderson
Assistant Examiner—Jack I. Berman
Attorney, Agent, or Firm—Jackson E. Stanland

[57] ABSTRACT

Low-energy scanning transmission electron microscopy is achieved by using a sharply pointed electrode as a source of electrons having energies less than 10 eV and scanning the electron emitting pointed source across the surface of a self-supported thin film of material to be investigated at an essentially constant distance on the order of nanometers. The electrons transmitted through the specimen are sensed by a suitable detector and the output signal of the detector is used to control a display unit, such as a CRT display or a plotter. A scanning signal generating means simultaneously controls both the scanning of the electron emitting point source and the display unit while a separation control unit holds the distance between the point source and surface at a constant value. The electron emitting point source and associated mechanical drives as well as the specimen film and electron detector are all positioned in a vacuum chamber and isolated from vibration by a damped suspension apparatus.

14 Claims, 3 Drawing Figures

LOW-ENERGY SCANNING TRANSMISSION ELECTRON MICROSCOPE

DESCRIPTION

1. Technical Field This invention relates to a low-energy scanning electron microscope for investigating the properties of self-supported thin films in the transmission mode. Low-energy in this context refers to electrons having an energy not exceeding ten electron volts.

2. BACKGROUND ART

In the well-known conventional transmission electron microscope the electron source typically is a hairpin-shaped tungsten wire which emits electrons when heated. The emitted electrons are accelerated through a potential drop typically of 40 to 100 kV and then are transmitted through a very thin specimen. An electron lens arranged downstream from the specimen generates a typically 50 to 100-fold enlarged intermediate image. By means of one or more additional electron lenses, the intermediate image is further enlarged and projected onto a screen for observation.

In conventional electron microscopes the specimen can be damaged by ionizing events caused by the electrons passing through the specimen with energies of tens or even hundreds of keV. Indeed, in some caes, such as with electron beam lithography, such ionizing events have a useful function. However, in the investigation of protein crystals or biological molecules for biomedical purposes, such ionization effects cause catastrophic damage to the specimen and are highly undesirable. Unfortunately, it is not practical with a conventional electron microscope to reduce the energy of the electrons to a few electron volts or less because a very low acceleration voltage will result in an electron beam which cannot be suitably focussed. Either the resulting beam diameter would be much too large for practical use or the electron density in the resulting beam would be too low to be of practical use (or both). This situation exists with respect to the conventional transmission microscope both when it is operated in the conventional imaging mode and when it is operated in the scanning mode.

DISCLOSURE OF THE INVENTION

It is an object of the present invention to advance the usefulness of transmission electron microscopy by providing a way of avoiding the use of a high-energy electron beam and thereby reducing or avoiding damage to the specimen.

This object and other objects have been achieved by the present invention in which a low-energy scanning transmission electron microscope has been formed. It has already been established that slow, i.e. low-energy, electrons can be transmitted through self-supported thin films. In an article entitled "Slow-Electron Beam Attenuation by Gold Films", 10 Appl. Phys. Lett. 73–75 (1967), H. Kanter showed that if electrons with a 1.1 eV energy are incident upon a self-supported gold film having a thickness of 20 nm, one electron in 50,000 will emerge from the far side of the film without loss of energy. For a 5 nm gold film, Kanter's findings can be extrapolated to give a transmission of one in about 500. Since these are average values for a large-area electron beam, one might expect to find higher values if a low-energy electron beam could be very narrowly focussed to form a more intense small area low-energy electron beam. As previously pointed out, however, this cannot be done with a conventional electron beam apparatus, since low-energy electron beams cannot be focussed to form a small area beam of practical electron density.

In accordance with this invention, a small area of a surface is bombarded with low-energy electrons without any need to do focussing by emitting the low-energy electrons from a point source and positioning the point source suitably close to the film being investigated.

An electron emitting pointed electrode is physically scanned in close proximity to a self-supported thin film specimen or target. The voltage between the film and the electrode is maintained at preferably one volt or less so that low-energy electrons are emitted from the electrode and travel towards the film. An electron sensing device is positioned on the opposite side of the thin film for detecting low-energy electrons which have been emitted by the electrode and which have passed through the thin film.

When the separation between the pointed electrode and the film is less than about 1 nm, the electron clouds of the atoms at the apex of the pointed electrode and at the surface opposite the apex touch, and a tunnel current path is established between the apex of the pointed electrode and the film. When the separation is more than about 3 nm, electrons must leave the pointed source via field emission. When the separation is between about 1 and 3 nm, both current effects are experienced. In any case, the area of the surface receiving the electrons has a diameter roughly equal to the distance between the point source and the specimen.

In the prior art, low-energy electrons also have been emitted from a point source positoned close to a surface in the Scanning Tunneling Microscope, described by G. Binnig et al., for example, in the article entitled, "Surface Studies by Scanning Tunneling Microscopy", 49 Phys. Rev. Lett. 57–61 (1982), and in the article entitled, "Tunneling Through a Controllable Vacuum Gap," 40 Appl. Phys. Lett. 178–180 (1982), and in U.S. Pat. No. 4,343,993. Low-energy electrons have also been emitted from a point source positioned close to a surface in the apparatus described by R. D. Young in "Field Emission Ultramicrometer", 37 Rev. Sci. Instrum. 275–278 (1966).

While it may be observed in retrospect that these prior art devices incidently irradiate a small surface area with low-energy electrons, these devices were not used to do transmission electron microscopy but rather were used to measure distance or height. In the present invention low-energy electrons from a point electron source are being applied to a thin film for the purpose of transmitting some of the electrons through the film for collection by an electron detector. The specimen being irradiated with the prior art devices was not in the form of a thin film. Low-energy electrons did not pass through the prior art specimen. In the prior art devices the effect that the proximate surface had upon the emission characteristics of the source was used to control or measure the position of the electron source with respect to the surface for the purpose of measuring the position or height of the proximate surface. No known prior art uses a point electron source positioned very close to a surface for the direct and sole purpose of applying low-energy electrons to a small area of the surface rather than detecting the position or height of the surface.

DESCRIPTION OF THE PREFERRED EMBODIMENTS

Figure 1:
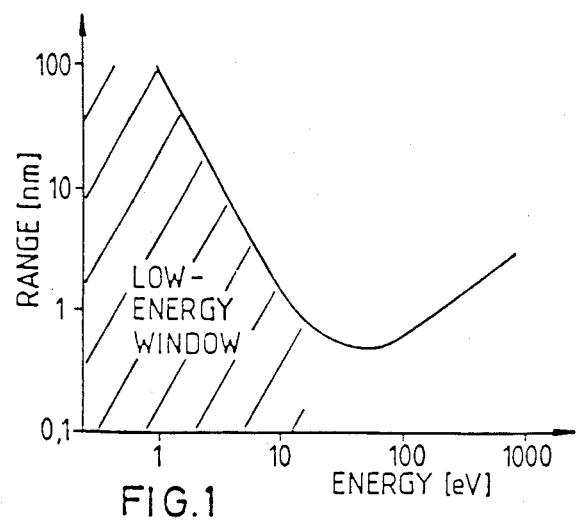
FIG. 1 is a graph showing the range of electrons between scattering events in relation to their energies.

FIG. 1 is a diagram showing the range through which electrons can travel between scattering events, with relation to their energy. The diagram shows the existence of a "low-energy window" for electrons with energies typically below 10 eV.

Figure 2:
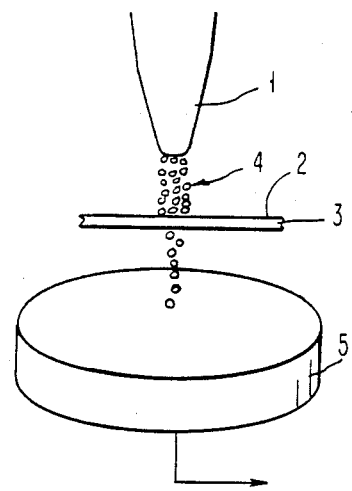
FIG. 2 schematically illustrates the principle of the electron microscope in accordance with this invention with the elements not drawn to scale.

Referring now to FIG. 2, for the electrons to arrive at the surface 2 of the material 3 to be investigated, the distance between the apex of the electron emitting point 1 and surface 2 must be on the order of 1 nm for an energy of about 10 eV. Two operating modes can be distinguished. First, for a distance greater than approximately 3 nm, the electrons leave point 1 by field emission. Second, for a distance shorter than approximately 1 nm, the electrons leaving point 1 will tunnel through that distance. In the tunneling mode, the energy of the electrons is less than 1 eV. In the field emission mode, the energy of the electrons increases with the distance.

Figure 3:
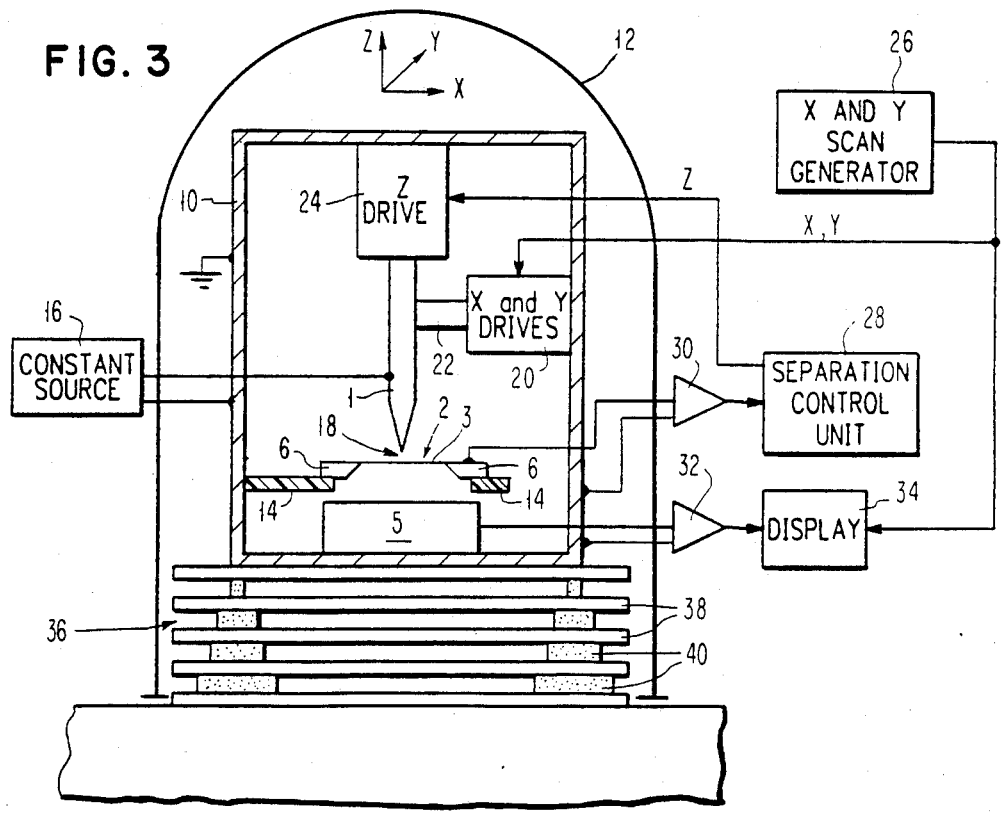
FIG. 3 is a schematic illustration of one embodiment of an electron microscope in accordance with this invention.

The material to be investigated takes the form of a self-supported thin film 3, i.e. the material is mounted across a hole in a support 6 as shown more clearly in FIG. 3. Of the electrons 4 incident upon surface 2 of thin film 3, some electrons will be transmitted through the material either with or without loss of energy. These transmitted electrons are detected by a conventional electron detector 5 arranged on the opposite side of film 3.

The arrangement of FIG. 2 shows transmission of electrons 4 through one particular spot of the specimen 3. Various ways are known in the prior art for scanning the specimen in a regular fashion so as to form an image of the entire specimen. In the conventional scanning electron microscope the scanning action is obtained by way of appropriately deflecting the electron beam on its way from the electron gun (or field emission source) to the specimen. A cathode ray tube is scanned in synchronism with the beam deflection electronics, such as by driving it from the same scan generator, so that each beam position on the specimen corresponds to a unique position on the cathode ray tube.

In contrast to the conventional scanning electron microscope, the microscope in accordance with the present invention requires a mechanical scanning system since the emitted electrons here travel only through a distance of a few nanometers (at most), which does not permit any deflection of the electrons or space for any deflection coils or electrodes. A rather simple mechanical deflection mechanism may be used which employs, e.g. lead screws for coarse positioning of the electrode 1 with respect to film 3, and piezoelectric elements for fine positioning and scanning. Mechanical positioning and scanning apparatus suitable for this purpose has been described by Binnig et al. in the articles and patent cited earlier, which are hereby fully incorporated by reference. Another suitable piezoelectric XY translator is described in IBM Technical Disclosure Bulletin Vol. 26, No. 10A, March 1984, at pages 4898–4899.

These prior art mechanical positioning devices permit a one-to-one correspondence to be established between each point on the specimen or film 3 and each point on the cathode ray tube. It will be obvious to those of ordinary skill in this art that instead of a cathode ray tube display a graphical recorder or a similar display device such as a plotter can be used so long as the mentioned one-to-one relationship between locations on the specimen and on the image is maintained.

As the electron emitting point source scans across the specimen each spot on the specimen is exposed to electrons for some fixed length of time (dwell time) which is determined by the speed of the scan and size of the irradiated area. During this dwell time (or a part thereof), the electrons interact with the specimen and the number of transmitted electrons depends on the characteristics of the specimen at that particular scanning location. The transmitted electrons are sensed by an appropriate detector (either individually by "pulse counting" techniques or collectively as an electron current), and the signals formed by the detector are suitably amplified and used, for example, to control the brightness of a cathode ray tube display for that particular scanning location or to give a bright dot for each electron that is detected or to control the instantaneous print density of a plotter or to plot a single line scan or an array of line scans. It should be apparent to one of ordinary skill in this art, furthermore, that the signals formed by the detector (or an amplified version thereof) alternatively or additionally could be stored for later conversion to pictorial representation or for used by a computer capable of doing image processing.

Detectors useful for monitoring transmitted electrons are known in the art. One example is the Everhart-Thornley detector described in J. Sci. Instr., Vol. 37, at page 246 (1960). Any secondary electron detector which can be used in a scanning electron microscope also should be suitable for this purpose.

A microscope in accordance with the present invention is schematically shown in FIG. 3. An electron emitting point source 1, a holder 14 for a thin film 3 of the material to be investigated, and an electron detector 5 are supported (directly or indirectly via one or more mechanical drives) from a common frame 10 within a vacuum chamber 12 (which may be part of an existing scanning electron microscope).

Source 16 maintains either a constant voltage or a constant current across a small gap 18 separating the electron emitting point source 1 and the thin film 3. In the constant voltage mode of operation, for example, the potential of electrode 1 may be maintained by source 16 at about 0.5 to about 10 volts negative with respect to the potential of the thin film 3.

A mechanical scanning mechanism is associated either with the electrode 1 or with the specimen holder 14, whichever is most convenient. In FIG. 3, an X,Y mechanical scanning mechanism 20 is mounted directly upon frame 10 and controls the motion of electrode 1 in the X and Y directions via an arm 22. The electrode 1 is carried by the Z direction mechanical scanning mechanism 24, which is in turn mounted also on the frame 10. Dynamic control of the Z position, in addition to the scan directions X,Y, allows the distance between electrode 1 and surface 2 of the specimen to be maintained constant despite any possible roughness of the surface. An X,Y scan generator 26 provides signals to X,Y drive 20 for scanning point 1 across surface 2 along the X and Y coordinates. Simultaneously, a separation control unit 28 responding to sensed signals characteristic of the actual separation between the surface 2 and the electrode 1 develops a Z signal for separation control by the Z drive 24.

If source 16 maintains a constant voltage across gap 18, then separation control unit 28 may respond to the amplitude of the current flowing between the surface 2 and electrode 1, since at constant voltage this current becomes larger if the separation between surface 2 and electrode 1 is reduced. This current may be detected indirectly (as illustrated) by monitoring the amount of current flowing to the specimen (or specimen holder) with a current amplifier 30. Alternatively, the current flowing from electrode 1 to the constant current source 14 may be directly monitored (not illustrated).

If source 16 instead maintains a constant current across gap 18, then separation control unit 28 may respond to the voltage across gap 18 (not shown), since at constant current this voltage depends upon the separation between electrode 1 and surface 2.

Detector 5 collects electrons which pass through film 3 and provides either an amplitude signal or a series of pulses to amplifier 32 for display unit 34. Display 34 is scanned in synchronism with the scanning of point 1 since both receive their scanning signals from the same scan generator 26. Display 34 may be a cathode ray tube or a graphic output device such as a plotter or similar device. In view of the fact that electrode 1 is scanned over surface 2 at a separation distance in the nanometer range, and that the resolution attainable with a piezoelectric X-Y translation mechanism also is on the same order of maqnitude, it is important that the electrode 1 and specimen 3 be isolated from external sound and vibration. This may be achieved, for example by mounting everything inside of vacuum chamber 12 on a damped suspension apparatus 36. The damped suspension apparatus may simply consist of a stack of plates 38 separated by elastic members 40. In order to provide for absorption of vibrations of different frequencies, the cross-sections and/or elasticities of the elastic members 40 may vary along the stack.

Having thus described our invention, what we claim as new and desire to secure by Letters Patent is:

1. A low-energy scanning transmission electron microscope, comprising:
    a pointed electrode;
    a thin film sample spaced less than 100 nanometers from said electrode;
    means providing flow of low-energy electrons from said electrode to said spaced sample without focusing elements, some of the low-energy electrons passing through the sample;
    means for mechanically scanning said pointed electrode with respect to the sample; and
    electron sensing means for detecting low-energy electrons from said electrode which have passed through the sample.

2. A microscope as defined in claim 1 and further comprising display means synchronized with said scanning means for producing an image representation of the low-energy electrons detected by said electron sensing means.

3. A microscope as defined in claim 1 and further comprising display means synchronized with said scanning means for producing a line scan representation of the low-energy electrons detected by said electron sensing means.

4. A microscope as defined in claim 1 wherein said thin film sample is self-supported.

5. A microscope as defined in claim 1 wherein said low-energy electrons have an energy less than 10 electron volts.

6. A microscope as defined in claim 1 wherien said electrode and thin film sample are spaced from each other by a distance which is less than 10 nanometers.

7. A microscope as defined in claim 6 wherein said electrode and thin film sample are spaced from each other by a distance of approximately 1 nanometer.

8. A microscope as defined in claim 1 wherein said means providing flow of low-energy electrons comprises a constant voltage source electrically connected between said electrode and said thin film sample.

9. A microscope as defined in claim 1 wherein said means providing flow of low-energy electrons comprises a constant current source electrically connected between said electrode and said thin film sample.

10. A microscope as defined in claim 1 and further comprising means for controlling the separation between said electrode and thin film sample such that it remains substantially constant.

11. A microscope as defined in claim 11 wherein said means for controlling separation comprises:
    means for applying a constant voltage between said electrode and said sample;
    means for measuring the current which flows from said electrode to said sample; and
    means for controlling the separation so as to make the measured current substantially constant.

12. A microscope as defined in claim 11 wherein said means for controlling separation comprises: means for driving a constant current between said electrode and said sample;
    means for measuring the voltage between said electrode and said sample; and
    means for controlling the separation so as to make the measured voltage substantially constant.

13. A microscope as defined in claim 10 wherein said controlled separation is less than 10 nanometers.

14. A microscope as defined in claim 13 wherein said controlled separation is about 1 nanometer.

* * * * *